(12) United States Patent
Gharia

(10) Patent No.: US 9,583,166 B2
(45) Date of Patent: Feb. 28, 2017

(54) MAGNETORESISTIVE RANDOM-ACCESS MEMORY

(71) Applicant: Broadcom Corporation, Irvine, CA (US)

(72) Inventor: Nilesh Gharia, Morgan Hill, CA (US)

(73) Assignee: Broadcom Corporation, Irvine, CA (US)

( * ) Notice: Subject to any disclaimer, the term of this patent is extended or adjusted under 35 U.S.C. 154(b) by 395 days.

(21) Appl. No.: 13/918,443

(22) Filed: Jun. 14, 2013

(65) Prior Publication Data

US 2014/0340958 A1 Nov. 20, 2014

Related U.S. Application Data

(60) Provisional application No. 61/824,720, filed on May 17, 2013.

(51) Int. Cl.
*H01L 27/22* (2006.01)
*G11C 11/16* (2006.01)

(52) U.S. Cl.
CPC .......... *G11C 11/161* (2013.01); *H01L 27/222* (2013.01); *H01L 27/228* (2013.01)

(58) Field of Classification Search
CPC ............................. H01L 27/222; H01L 27/228
See application file for complete search history.

(56) References Cited

U.S. PATENT DOCUMENTS

| | | | |
|---|---|---|---|
| 8,023,299 B1 | 9/2011 | Gharia | |
| 2008/0225585 A1* | 9/2008 | Ranjan et al. | 365/173 |
| 2008/0310213 A1* | 12/2008 | Chen et al. | 365/158 |
| 2010/0172173 A1* | 7/2010 | Abu-Rahma et al. | 365/158 |
| 2012/0008367 A1* | 1/2012 | Kajiyama | 365/148 |
| 2012/0155154 A1* | 6/2012 | Shukh | 365/158 |

* cited by examiner

*Primary Examiner* — Benjamin Sandvik
*Assistant Examiner* — Leslie Pilar Cruz
(74) *Attorney, Agent, or Firm* — Sterne, Kessler, Goldstein & Fox P.L.L.C.

(57) ABSTRACT

A memory cell comprises a dual-gate fin field effect transistor (FinFET) and first and second serially connected magnetic tunnel junction (MTJ) devices for improving reliability of memory operations. The FinFET represents an access transistor and includes a first gate and a second gate. The second gate is configured to be electrically independent from the first gate and to adjust threshold voltage of the FinFET. Each of the first and second MTJ devices represent a magnetic storage element and includes at least two ferromagnetic (FM) layers separated by a thin insulating layer forming a tunneling junction. Based on the relative magnetization of the two FM layers, each MTJ device has high and low resistance states. Higher reliability of memory write operation is primarily achieved with the help of FinFET and higher reliability of memory read operation is primarily achieved with increased read margin.

22 Claims, 16 Drawing Sheets

FIG. 7

ND-ACCESS
MEMORY

BACKGROUND

Field of the Disclosure

The present disclosure generally relates to semiconductor devices, and more specifically to memory devices including fin field effect transistor (FinFET) and magnetic tunnel junction (MTJ) devices.

Background Art

A memory is an electronic device for reading and/or writing electronic data. Each bit of the electronic data can be read from and/or written into a memory cell. Each of the memory cells can be coupled to one another to form an array of memory cells, which can be accessible to read and/or write the electronic data. The memory can be implemented as volatile memory, which requires power to maintain its stored information or non-volatile memory, which can maintain its stored information even when not powered. The volatile random-access memory can be implemented in configurations such as a dynamic random-access memory (DRAM), a static random-access memory (SRAM), and non-volatile random-access memory can be implemented in configurations such as flash memory, magnetoresistive random-access memory (MRAM).

MRAM is among the latest developments in non-volatile memory that exhibits desirable features such as non-volatility, high speed read/write operations, and low cost, of most popular types of memory. MRAM stores data in magnetic storage elements that are magnetic tunnel junction (MTJ) devices. MTJ devices include ferromagnetic layers separated by insulating layers. Read and write operations of MRAM are based on relative magnetization of the ferromagnetic layers. Write operations require higher current density than read operations in MRAM. It is desirable to reduce power consumption in MRAM for high speed write operations.

BRIEF DESCRIPTION OF THE DRAWINGS/FIGURES

The accompanying drawings illustrate the present disclosure and, together with the description, further serve to explain the principles of the disclosure and to enable one skilled in the pertinent art to make and use the disclosure.

FIG. 7 illustrates an example circuit configuration for a write operation of the memory cell of FIG. 2 to write logical value '0' according to an example of first embodiment of the present disclosure.

Figure 1:
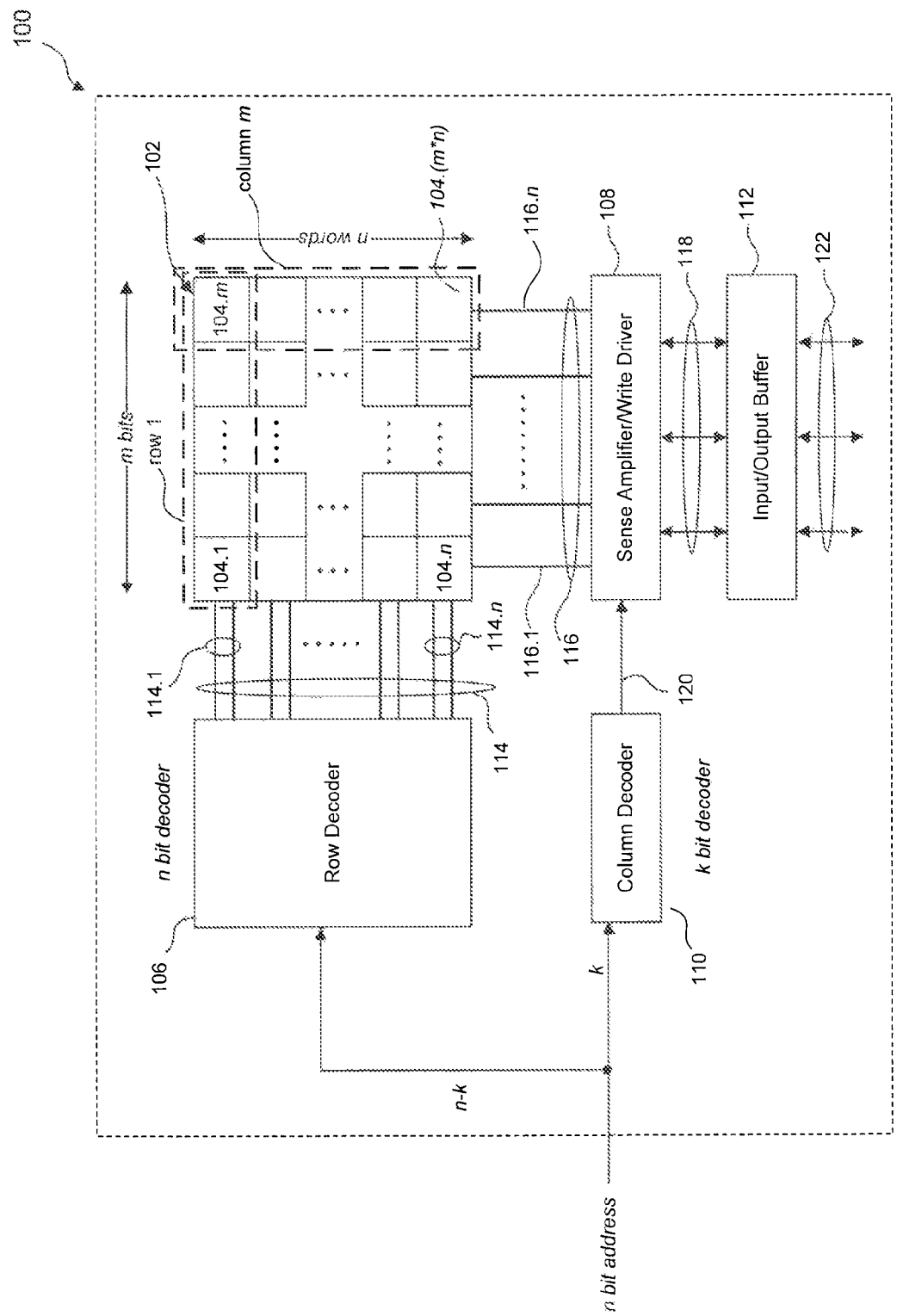
FIG. 1 illustrates a block diagram of a memory device according to an example embodiment of the present disclosure.

The present disclosure will now be described with reference to the accompanying drawings. In the drawings, like reference numbers generally indicate identical, functionally similar, and/or structurally similar elements. The drawing in which an element first appears is indicated by she leftmost digit(s) in the reference number.

DETAILED DESCRIPTION OF THE DISCLOSURE

The following Detailed Description refers to accompanying drawings to illustrate one or more embodiments consistent with the present disclosure. The disclosed embodiment(s) merely exemplify the disclosure. References in the Detailed Description to "an example embodiment," "an example of this embodiment," etc., indicate that the embodiment(s) described can include a particular feature, device, or characteristic, but every embodiment can not necessarily include the particular feature, device, or characteristic. Moreover, such phrases are not necessarily referring to the same embodiment. Further, when a particular feature, device, or characteristic is described in connection with an embodiment, it is within the knowledge of those skilled in the relevant art(s) to effect such feature, device, or characteristic in connection with other embodiments whether or not explicitly described.

The embodiments described herein are provided for illustrative purposes, and are not limiting. Other embodiments are possible, and modifications can be made to the embodiments within the spirit and scope of the present disclosure. Therefore, the Detailed Description is not meant to limit the present disclosure. Rather, the scope of the present disclosure is defined only in accordance with the following claims and their equivalents.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

It is to be understood that the phraseology or terminology herein is for the purpose of description and not of limitation, such that the terminology or phraseology of the present specification is to be interpreted by those skilled in relevant art(s) in light of the teachings herein.

Unless otherwise indicated, the drawings provided throughout the disclosure should not be interpreted as to-scale drawings. The logic levels and/or the default voltage states are provided for exemplary purposes only. Those skilled in the art will appreciate that logic levels can be reversed such that transistors are asserted using an active-low or an active-high logic scheme. Transitions of data or logical values from one state to another should not be interpreted as an implication that the previous state was a default, standard, static, and/or an unchanging state.

A Memory Device According to an Example Embodiment

FIG. 1 illustrates a block diagram of a memory device 100 according to an example embodiment. Memory device 100 represents, for example, a non-volatile magnetoresistive random access memory (MRAM). As a non-volatile memory, memory device 100 can maintain stored electronic data even when not powered, unlike volatile random access memory such as static random access memory or dynamic random access memory. Memory device 100 may operate in a read mode of operation to read electronic data from one or more memory cells, or in a write mode of operation to write electronic data into the one or more memory cells.

Memory device 100 may include a memory array 102, row decoder 106, a sense amplifier 108, a column decoder 110, an input/output (I/O) buffer 112, a plurality of pairs of word lines 114, and a plurality of bit lines 116.

Memory array 102 includes a plurality of memory cells 104 that may be configured to form an array according to this embodiment. FIG. 1 illustrates, for example, memory cells 104 arranged in an array of n rows and m columns, where m and n are any integer numbers. Memory cells 104.1 through 104.($m*n$) may each represent an individual memory cell of memory array 102. Each of the memory cells 104.1 through 104.($m*n$) of memory array 102 may be connected to a bit line and a pair of word lines, in an example of this embodiment. For minimizing area of memory device 100, memory cells 104 in each of m columns of memory array 102 may share a bit line and have the same column address. Similarly, memory cells 104 in each of n rows of memory array 102 may share a pair of word lines and have the same row address. For example, in FIG. 1 memory cells 104.1 through 104.$m$ of row 1 share the same pair of word lines WL 114.1, and memory cells 104.$m$ through 104.($m*n$) of column m share the same bit BL 116.1. In order to select a particular memory cell for a mode of operation, the bit line and the pair of word line associated with this particular memory cell may be activated. For example, memory cell 104.1 may be selected by activating bit line 116.1 and pair of word lines 114.1. Each memory cell of memory array 102 can be programmed to write one bit or multiple bits of electronic data in a write mode of operation, which can be read by memory device 100 in a read mode of operation.

Pairs of word lines 114 may be activated based on a row address applied to row decoder 106. In an example of this embodiment, row decoder 106 may be coupled to memory array 102 and configured to select one or more rows of memory cells 104 corresponding to an n-bit address input to the memory device 100. Row decoder 106 may decode n-k bits of the n-bit address and provide control signals to pairs of word lines that correspond to n-k bits of the n bit address. This may allow memory array 102 to select a row of memory cells 104 corresponding to the n-bit address for a mode of operation of memory device 100. In a read mode of operation, selecting a row of memory cells 104 allows memory array 102 to access one word of m bits from among n words of electronic data stored in the memory cells 104.

Activation of bit lines 116 are based on a column address applied to column decoder 110. According to an example of this embodiment, column decoder 110 may be coupled to sense amplifier 108. Column decoder 110 provides control signal 120 to sense amplifier in order to activate bit lines 116 that corresponds to k bits of the n-bit address. Sense amplifier 108 during a read mode operation may be controlled by column decoder 110 to access a subset, or block, of the m bits from the row selected by row decoder 106. The block of the m bits may be output as a block of electronic data 118 in the read mode of operation. The I/O Buffer 112 may store the block of electronic data 118 to provide a block of electronic data 122.

A Memory Cell According to a First Embodiment

Figure 2:
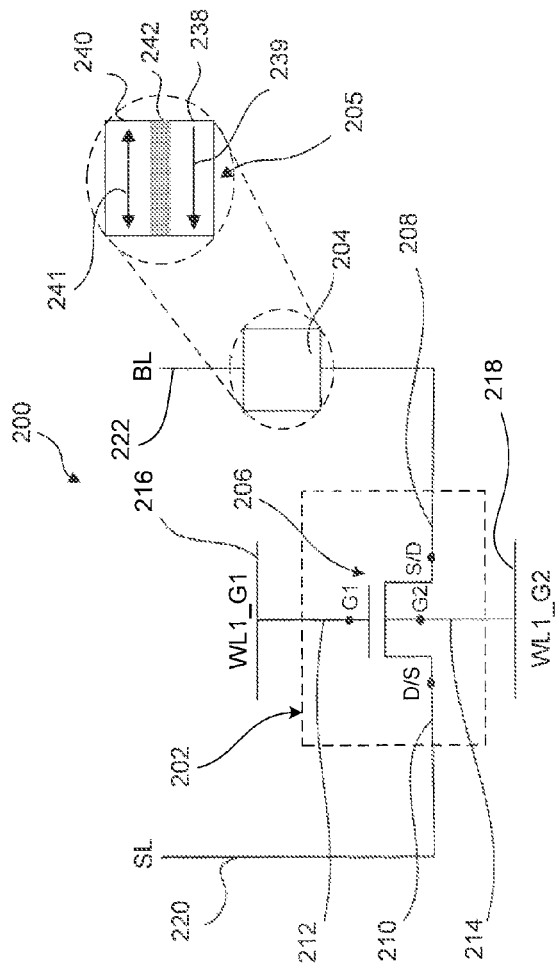
FIG. 2 illustrates a schematic diagram of a memory cell according to a first embodiment of the present disclosure.

FIG. 2 illustrates a schematic diagram of a memory cell 200, according to a first embodiment. Memory cell 200 may represent one or more memory cells of the plurality of memory cells 104 in FIG. 1. Memory cell 200 includes an access transistor 202 and a magnetic storage element 204 that may be non-volatile.

Magnetic storage element 204 may be connected to a bit line 222. Bit line 222 may represent one or more of bit lines of the plurality of bit lines 116 shown in FIG. 1. Magnetic storage element 204 may be configured to hold a logical value (e.g., '1' or '0') based on magnetization states of the magnetic storage element 204.

Access transistor 202 may be configured to control access to magnetic storage element 204 during, for example, a read mode operation to read a logical value (e.g., '1' or '0') from magnetic storage element 204 or a write mode of operation to write a logical value (e.g., '1' or '0') to magnetic storage element 204. Controlling access to magnetic storage element 204 may comprise controlling an amount of current driving through magnetic storage element 204 in an example of this embodiment. The amount of current driving through magnetic storage element 204 may be dependent on the modes of operation of memory cell 200. For example, a smaller current may be passed through magnetic storage element 204 to read a logical value (e.g., '1' or '0') compared to the amount of current passed to write a logical value (e.g., '1' or '0') to magnetic storage element 204.

In an example of this embodiment, access transistor 202 may be a multi-terminal transistor, for example, a dual-gate FinFET 206. FinFET 206 may be configured to be an n-channel FinFET comprising a first terminal 208 connected to source/drain S/D, a second terminal 210 connected to drain/source D/S, a first gate terminal 212 connected to first gate G1, and a second gate terminal 214 connected to second gate G2. It is understood by a skilled artisan that the source S and drain D of a FinFET may be interchangeable and are named based on voltage values applied to first and second terminals 208 and 210. First and second terminals 208 and 210 may be connected to magnetic storage element 204 and a select line 220, respectively. First and second gate terminals 212 and 214 may be connected to a first word line 216 and a second word line 218. First and second word lines 216 and 218 may represent one or more pairs of word lines of the plurality of word lines 114 shown in FIG. 1, according to an example of this embodiment.

Figure 3:
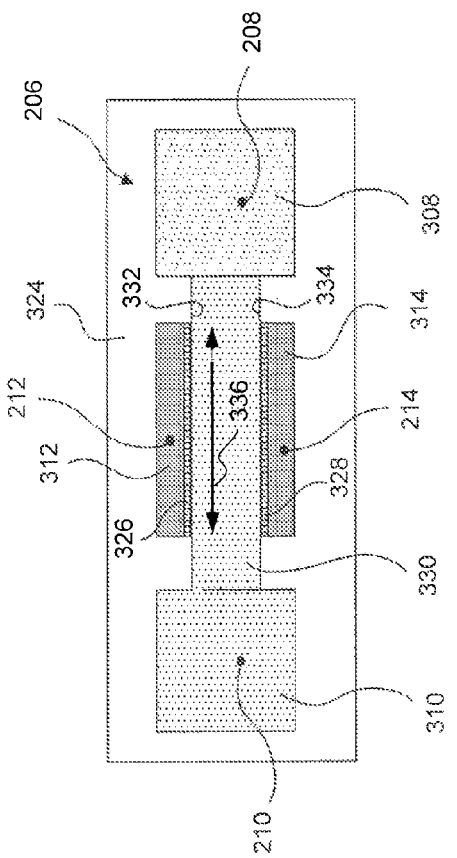
FIG. 3 illustrates a top view of an example layout of a dual gate FinFET according to an example embodiment of the present disclosure.

FIG. 3 illustrates a top view of an example layout of FinFET 206 including a first region 308, a second region 310, a first gate region 312, and a second gate region 314. Each of these regions may be electrically coupled to first terminal 208, second terminal 210, first gate terminal 212, and second gate terminal 214, respectively. First and second gate regions 312 and 314 may represent the first and second gates G1 and G2 shown in FIG. 2. First and second regions 308 and 310 may be referred as source and drain regions or drain and source regions, respectively, of FinFET 206 based on relative voltage value between voltage values at first and second terminals 208 and 210.

Also, FinFET 206 comprises a fin region 330 between and in substantial contact with first and second regions 308 and 310. Fin region 330 may be configured to provide a conducting path between first and second regions 308 and 310. Fin region 330 may be further configured to electrically isolate first gate and second gate regions 312 and 314. This electrical isolation may allow first and second gate regions 312 and 314 to be controlled independently of each other through first and second gate terminals 212 and 214. For example, first gate terminal 212 may be configured to be an input terminal to activate FinFET 206, while second gate terminal 214 may be configured to adjust a threshold voltage value of FinFET 206. Threshold voltage value may be a value above which FinFET 206 may turn on and allow conduction between first and second regions 308 and 310.

Further, FinFET 206 comprises a first insulating region 326 between and in substantial contact with fin region 330 and first gate region 312, and a second insulating region 328 between and in substantial contact with fin region 330 and second gate region 314. First insulating region 326 may allow first gate region 312 to be capacitively coupled to fin region 330 on its first side 332. Similarly, second gate region 314 may be capacitively coupled to fin region 330 on its second side 334 through second insulating layer 328. A channel region of length 336 may be formed in fin region 330 between first and second gate regions 312 and 314. In an example of this embodiment, the regions 308, 310, 312, 314, 326, 328, and 330 illustrated in FIG. 3 may be formed on and in substantial contact with a top surface 324 of a silicon substrate having a buried oxide (BOX) layer.

Referring back to FIG. 2, magnetic storage element 204 may be an MTJ device 205 in accordance to an example of this embodiment. MTJ device 205 may include a first ferromagnetic (FM) layer 238, a second FM layer 240, and an insulating layer 242. First FM layer 238 is electrically connected to first terminal 208, while second FM layer 240 is electrically connected to bit line 222. First and second FM layers 238 and 240 may comprise ferromagnetic materials such as, but not limited to, iron (Fe), cobalt (Co), or nickel (Ni). First and second FM layers 238 and 240 may comprise the same material or different materials with respect to each other. At the same time, these FM layers 238 and 240 may have equal or different thickness with respect to each other. Insulating layer 242 may be configured to be very thin (e.g., 1-5 nm thick) compared to thickness of first and second FM layers 238 and 240 (e.g., 100-500 nm). This thin insulating layer 242 may allow the formation of a tunneling junction barrier between first and second FM layers 238 and 240. Insulating layer 242 may comprise materials such as, but not limited to, magnesium oxide or aluminum oxide.

First FM layer 238 may be configured with a magnetization fixed in a predetermined direction, for example, in a direction illustrated by arrow 239, while second FM layer 240 may be configured with a magnetization that is free to change directions, for example, in directions illustrated by double-headed arrow 241. Thus, MTJ device 205 may have two configurations. For example, a configuration of MTJ device 205 where relative orientation of magnetization direction of the two FM layers 238 and 240 is parallel and another configuration where the relative orientation is anti-parallel. Each of these configurations of MTJ device 205 may represent a logical value. For example, configuration of MTJ device 205 with parallel orientation of magnetization directions between FM layers 238 and 240 may represent logical value '0', while configuration with antiparallel orientation of magnetization directions between FM layers 238 and 240 may represent logical value '1'. Thus, bits may be stored in MTJ device 205 based on relative orientation of magnetization direction of first and second FM layers 238 and 240.

Writing of logical value '1' and '0' may be performed in MTJ device 205 by driving currents in particular directions through MTJ device 205, according to an example of this embodiment. For example, logical value '1' may be written in MTJ device 205 by flowing a current through MTJ device 205 from first FM layer 238 to second FM layer 240. This current may switch the magnetization direction of second FM layer 240 to be oriented from parallel to antiparallel with respect to the magnetization direction of first FM layer 238. For writing logical value '0' in MTJ device 205, current may be applied, for example, to flow through MTJ device 205 from second FM layer 240 to first FM layer 238. This direction of current flow through MTJ device 205 may switch the magnetization direction of second FM layer 240 to be oriented from antiparallel to parallel with respect to the magnetization direction of first FM layer 228. The writing current for logical value '1' may be larger than that for logical value '0'.

According to an example of this embodiment, MTJ device 205 may exhibit low resistance ($R_L$) when relative orientation of magnetization directions in FM layers 238 and 240 is parallel, but may exhibit high resistance ($R_H$) when the relative orientation is antiparallel. Thus, the logical values '1' and '0' corresponding to the relative orientations as mentioned above may also be represented by $R_H$ and $R_L$, respectively. Based on the resistance state of MTJ device 205, stored logical values may be read out from MTJ device 205 during read mode operation of memory cell 200.

For the sake of simplicity, only two FM layers 238 and 240 and one insulating layer 242 have been shown in MTJ device 205. In an example of this embodiment, MTJ device 205 may comprise a stacked structure with alternating FM and insulating layers (not shown).

Figure 4:
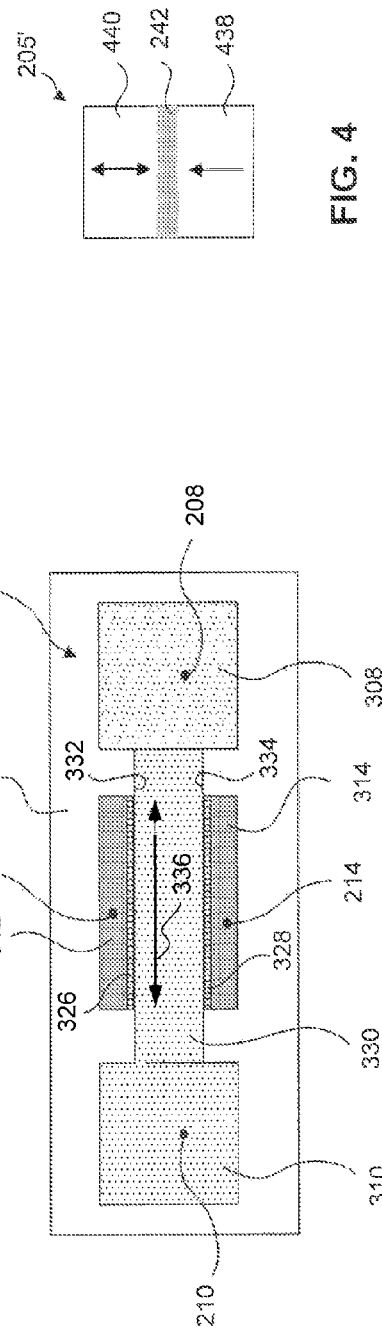
FIG. 4 illustrates a schematic diagram of an MTJ device with perpendicular magnetization according to an example embodiment of the present disclosure.

An alternative to MTJ device 205 may be MTJ device 205' illustrated in FIG. 4, according to an example of this embodiment. MTJ 205' is similar to MTJ 205 as described above, except for magnetization directions of first and second FM layers 438 and 440 being perpendicular with respect to the FM layers.

Figure 5:
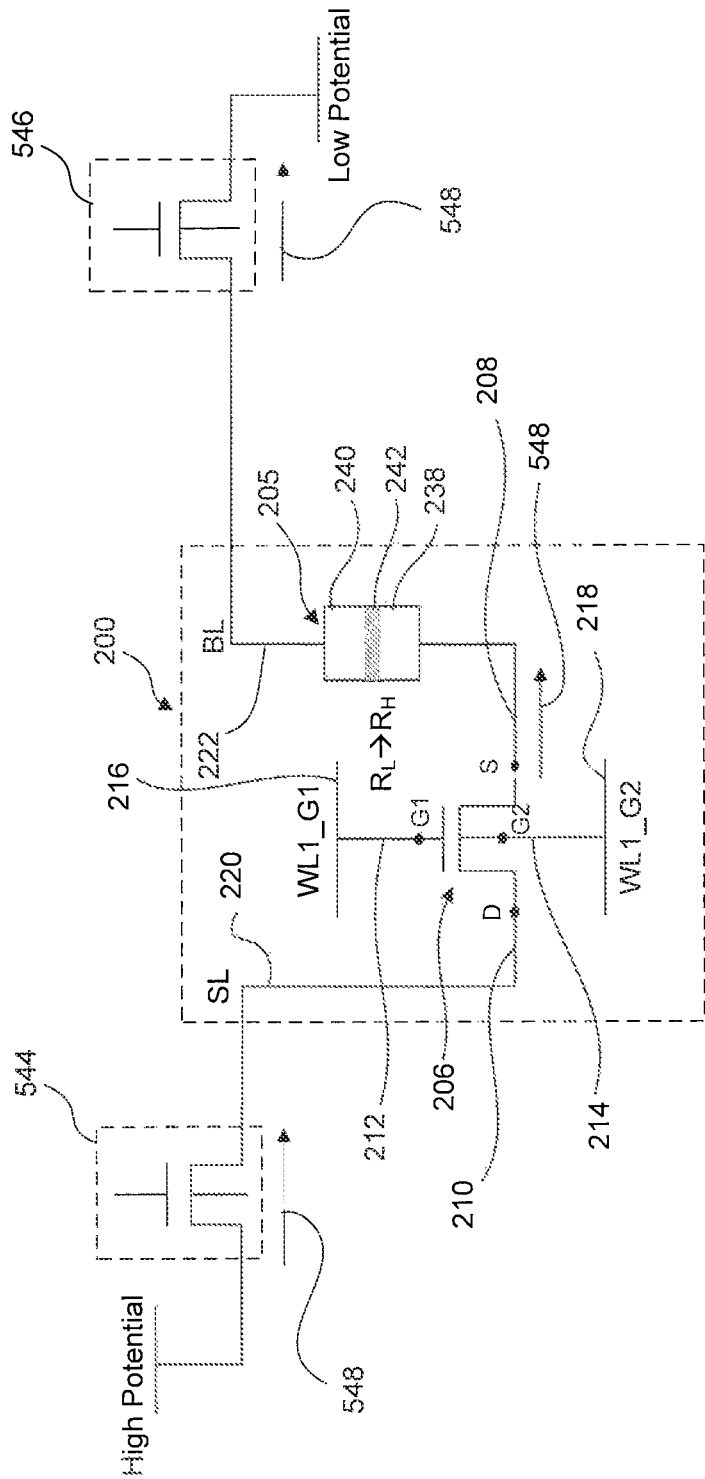
FIG. 5 illustrates an example circuit configuration for a write operation of the memory cell of FIG. 2 to write logical value '1' according to an example of first embodiment of the present disclosure.

Write Mode of Operation of a Memory Cell
According to an Example of the First Embodiment FIG. 5 illustrates an example circuit configuration for a write operation of memory cell 200 to write logical value '1' according to an example of first embodiment. Memory cell 200 may be connected to a first current source 544 and a second current source 546 through select line 220 and bit line 222, respectively. First and second current sources 544 and 546 may be configured to be p-channel or n-channel FinFET based current sources. Both current sources 544 and 546 may be activated depending on control signal applied to select line 220 and bit line 222. Activated first and second current sources 544 and 546 may control the flow of current through memory cell 200 when FinFET 206 also activated for any mode of operation.

As discussed above, for writing a logical value '1' into MTJ 205, a current may be required to pass through MTJ 205 from first FM layer 238 to second FM layer 240. This may be required in order to switch the magnetization direction of second FM layer 240 to be oriented from parallel to antiparallel with respect to the magnetization direction of first FM layer 238. For this purpose, a high potential (e.g., $V_{DD}$) and a low potential (e.g., $V_{SS}$ or ground) may be applied at second and first terminals 210 and 208 through first and second current sources 544 and 546, respectively, according to an example of this embodiment. At the same time, first and second current sources 544 and 546, and FinFET 206 may be activated through first and second word lines 216 and 218. Such a configuration may allow a current to flow in a direction illustrated by arrows 548.

During write operation of logical value '1' in MTJ 205, due to gradual increase in resistance of MTJ 205 when relative orientation of magnetization direction of FM layers 238 and 240 switches from parallel to antiparallel, current flow through FinFET 206 may decrease which in turn may hinder the magnetization switching process. To ensure flow of a large current through FinFET 206, second gate terminal 214 may be controlled by second word line 218 to lower the threshold voltage value of FinFET 206. The adjusting of the threshold voltage value may be done without increasing a voltage value at first gate terminal 212 through first word line 216, as second gate G2 may be controlled independently of the first gate G1 of FinFET 206. Lowering the threshold voltage of FinFET 206 may allow larger current to flow through FinFET 206 for the same voltage value at first gate terminal 212. Thus, independently controlled dual gate FinFET 206 may help to reduce power consumption during write operations of memory cell 200 when compared to conventional planar transistors representing access transistor 202.

With FinFET 206 representing as access transistor 202, the reliability of write operation of logical value '1' may also improve. This improvement in write operation may be due to lower voltage applied at first gate terminal 212 of FinFET 206 compared to that applied at gate terminals of conventional planar transistors representing access transistor 202. The lower applied voltage at first gate terminal 212 may slow down deterioration of gate regions in FinFET 206.

Figure 6:
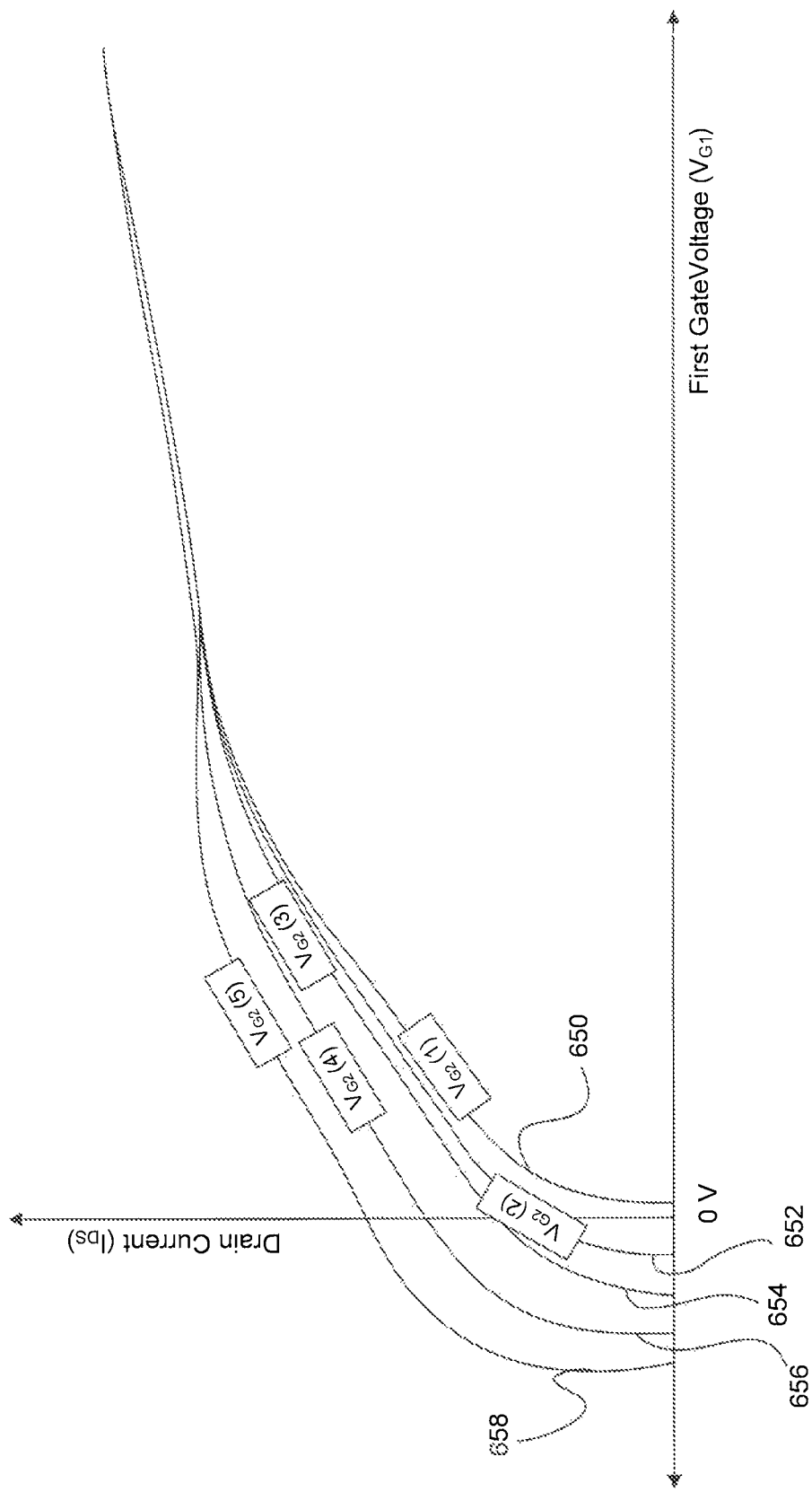
FIG. 6 illustrates current-voltage characteristic curves of a dual gate FinFET according to an example embodiment of the present disclosure.

FIG. 6 shows current-voltage characteristic curves of FinFET 206 according to an example of the first embodiment. A drain current ($I_{DS}$) that may flow between the first and second regions 308 and 310 is shown in FIG. 6 to vary with first gate voltage ($V_{G1}$) that may be applied to the first gate terminal 212. This variation of $I_{DS}$ with $V_{G1}$ is shown in FIG. 6 for different voltage values of second gate voltage ($V_{G2}$) that may be applied to the second gate terminal 214 to adjust the threshold voltage value of FinFET 206. Curve 650 illustrates that $I_{DS}$ flows when $V_{G1}$ value above 0V for a value of $V_{G2}(1)$. For an applied value of $V_{G2}(1)$, FinFET 206 may turn on for a $V_{G1}$ value above 0V. While, curves 652, 654, 656, and 658 show $I_{DS}$ to flow for respectively smaller values of $V_{G1}$ below 0V for increasing values of $V_{G2}(2)$, $V_{G2}(3)$, $V_{G2}(4)$, and $V_{G2}(5)$. This decrease in values of $V_{G1}$ may be due decrease in threshold voltage of FinFET 206 with changing values of $V_{G2}$.

Figure 7:
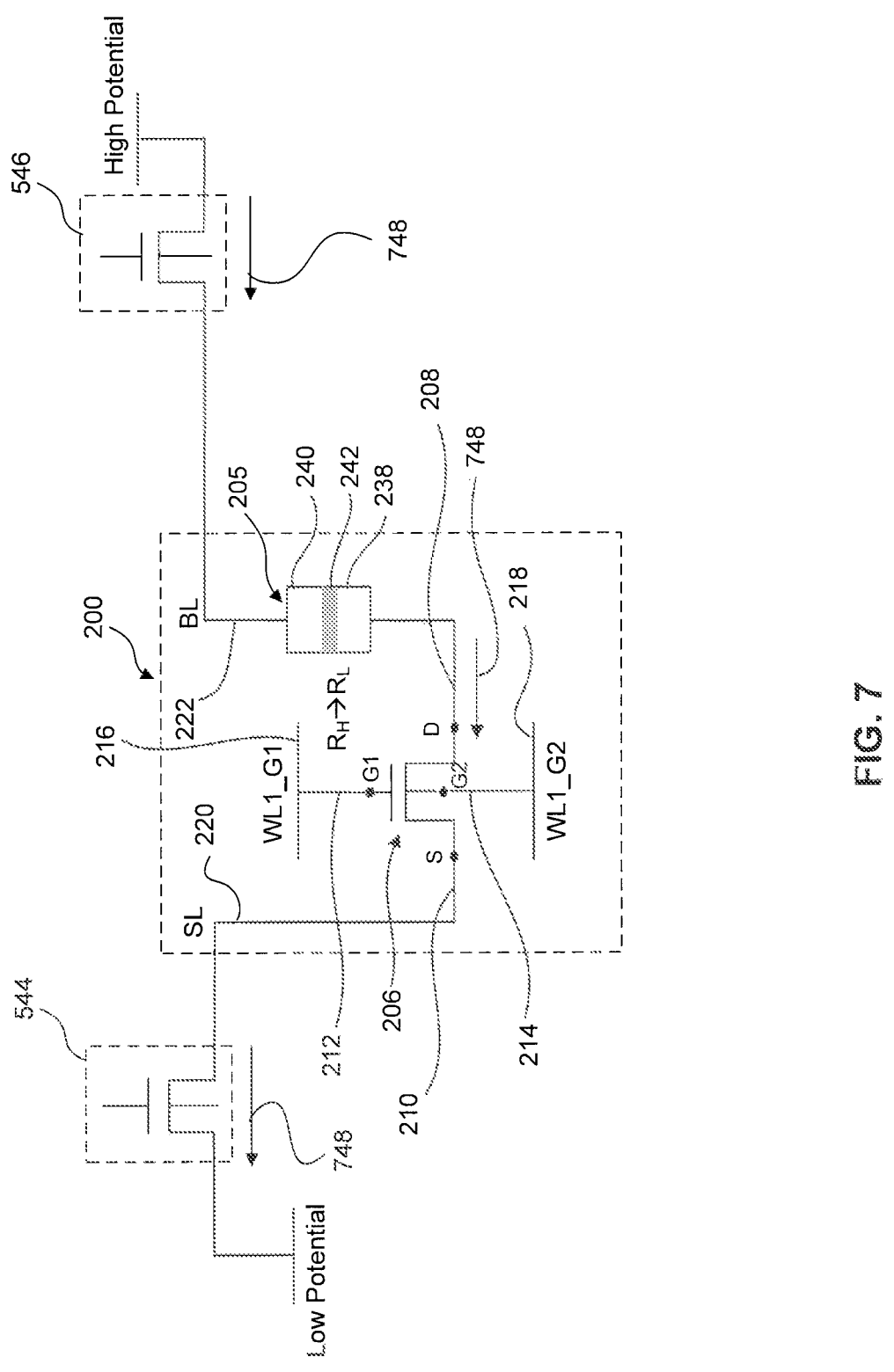

FIG. 7 illustrates an example circuit configuration for a write operation of memory cell 200 to write logical value '0' according to an example of the first embodiment. The configuration illustrated in FIG. 7 is similar to that of FIG. 5. Therefore, only differences between the configurations of FIG. 7 and FIG. 5 are to be discussed. As discussed above, for writing a logical value '0' into MTJ 205, a current may be required to pass through MTJ 205 from second FM layer 240 to first FM layer 238. The current flow through MTJ 205 may be required in order to switch the magnetization direction of second FM layer 240 to be oriented from antiparallel to parallel with respect to the magnetization direction of first FM layer 238. For this purpose, a high potential (e.g., $V_{DD}$) and a low potential (e.g., $V_{SS}$ or ground) may be applied at first and second terminals 208 and 210 through second and first current sources 546 and 544, respectively, according to an example of this embodiment. Such configuration may allow current to flow in a direction illustrated by arrows 748 which is opposite to that during writing of logical value '1'.

Figure 8:
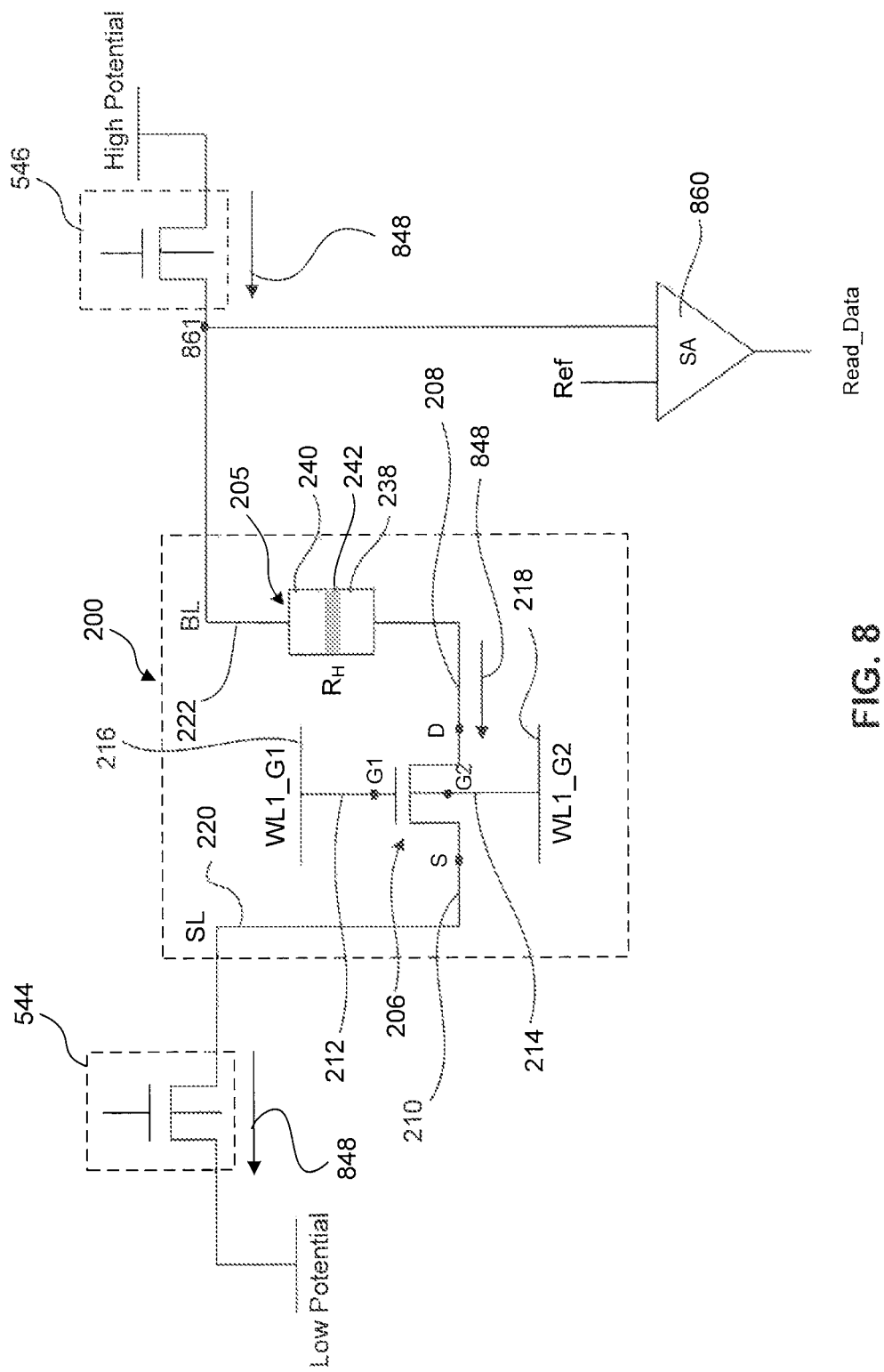
FIG. 8 illustrates an example circuit configuration for a read operation of the memory cell of FIG. 2 to read logical value '1' according to an example of first embodiment of the present disclosure.
Figure 9:
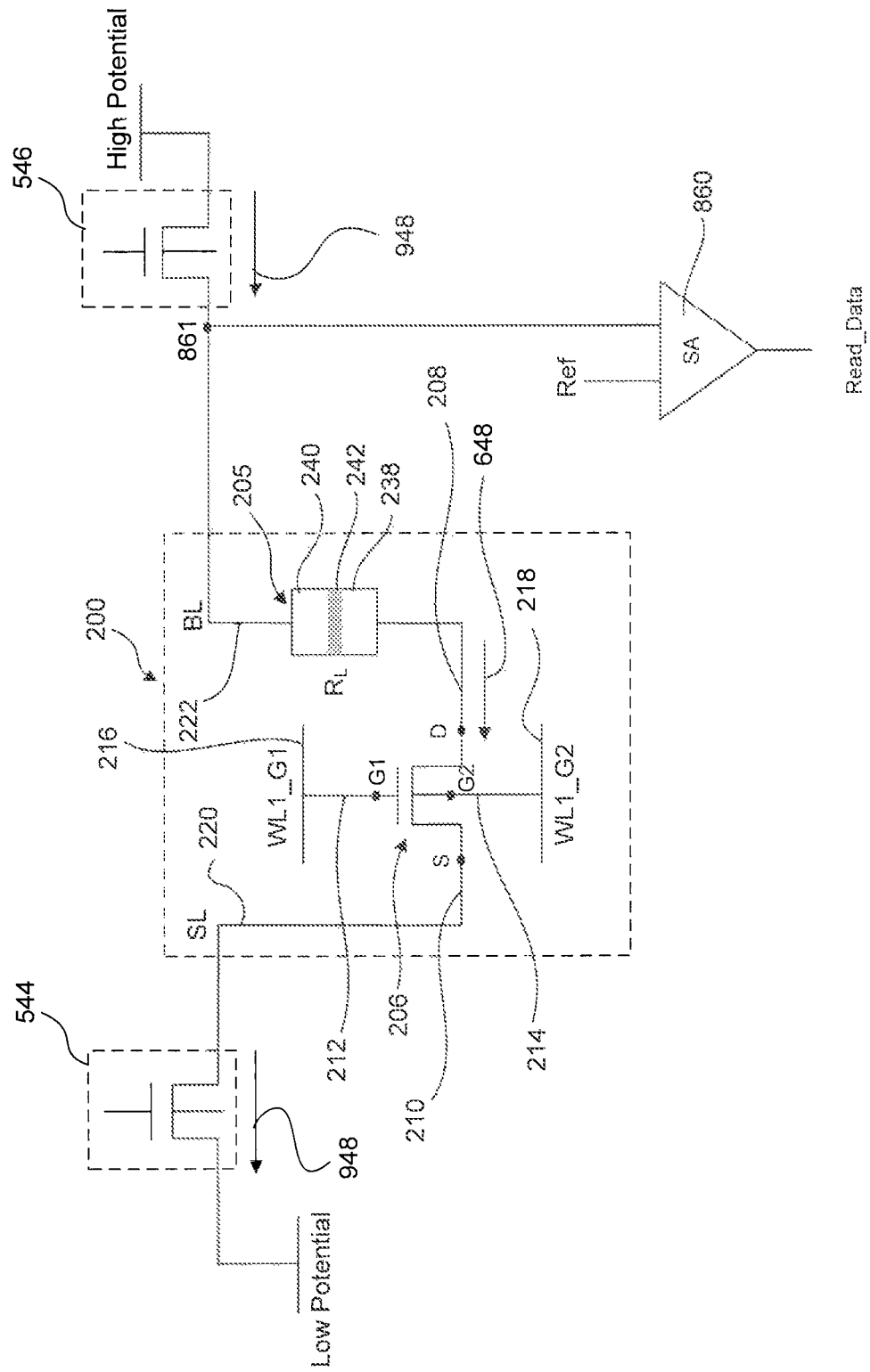
FIG. 9 illustrates an example circuit configuration for a read operation of the memory cell of FIG. 2 to read logical value '0' according to an example of first embodiment of the present disclosure.

Read Mode of Operation of a Memory Cell
According to an Example of the First Embodiment FIG. 8 illustrates an example circuit configuration for a read operation of the memory cell 200 to read logical value '1' according to an example of first embodiment. FIG. 9 illustrates an example circuit configuration for a read operation of the memory cell 200 to read logical value '0' according to another example of first embodiment. The configurations illustrated in FIGS. 8 and 9 are similar to that of FIG. 7. Therefore, only differences between the configurations of FIGS. 7, 8 and 9 are to be discussed.

For both readings of logical value '1' and '0', a sense amplifier 860 may be connected at node 861 between MTJ device 205 and second current source 546. As discussed above, stored logical values '1' and '0' in MTJ device 205 may be represented by high resistance state ($R_H$) and low resistance state ($R_L$) of MTJ device 205, respectively. Based on the resistance state of MTJ device 205, the resistance of the memory cell 200 may vary, and this variation in memory cell resistance may allow sense amplifier 860 to read the stored logical value from MTJ device 205. In an example of this embodiment, sense amplifier 860 may be configured to be a voltage sense amplifier in order to sense a voltage at node 861 that may be a voltage drop across MTJ 205 and FinFET 206. This sensed voltage may be compared to a reference voltage value Ref in order to determine the stored logical value in MTJ 205.

Alternatively, sense amplifier 860 may be configured to be a current sense amplifier in order to sense the current flowing through MTJ device 205 and compare the sensed current to a reference current value Ref.

A Memory Cell According to a Second Embodiment

Figure 10:
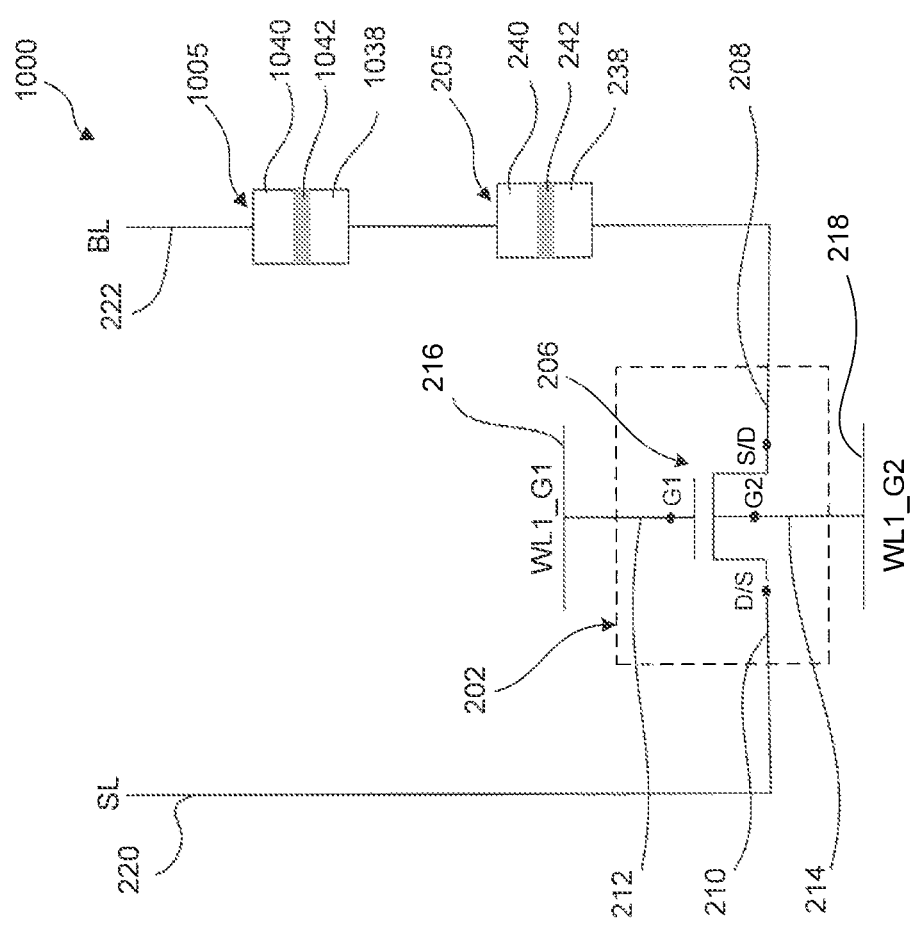
FIG. 10 illustrates a schematic diagram of a memory cell according to a second embodiment of the present disclosure.

FIG. 10 illustrates a schematic diagram of a memory cell 1000 according to a second example embodiment of the present disclosure. Memory cell 1000 is similar to memory device 200 as described above. Therefore, only differences between memory cells 200 and 1000 are to be described. A second MTJ device 1005 may be connected in series with the first MTJ device 205 described above. In an example of this embodiment, MTJ device 1005 may be similar to MTJ device 205. MTJ device 1005 may comprise a first FM layer 1038 with fixed magnetization, a second FM layer 1040 with magnetization free to change direction, and a thin insulating layer 1042 between FM layers 1038 and 1040. First FM layer 1038 of MTJ device 1005 is electrically connected to second FM layer 240 of MTJ device 205, while second FM layer 1040 of MTJ device 1005 is electrically connected to bit line 222. MTJ devices 205 and 1005 may have the fixed magnetization in their respective first FM layers 238 and 1038 oriented in the same direction or opposite direction. The thickness of the individual layers of MTJ device 1005 may be the same or different with respect to that of MTJ device 205. In addition, the MTJ devices 205 and 1005 may have the same or different tunnel magnetoresistance (TMR) values and magnetization orientations with respect to each other.

Similar to MTJ device 205, configuration of MTJ device 1005 with parallel orientation of magnetization directions between FM layers 1038 and 1040 may represent logical value '0', while configuration with antiparallel orientation of magnetization directions between layers 1038 and 1040 may represent logical value '1'. Thus, bits may be stored in and read from MTJ device 1005 in a similar manner as described above for MTJ device 205.

In another example of this embodiment, MTJ device 1005 may be similar to MTJ device 205' in reference to FIG. 4.

Figure 11:
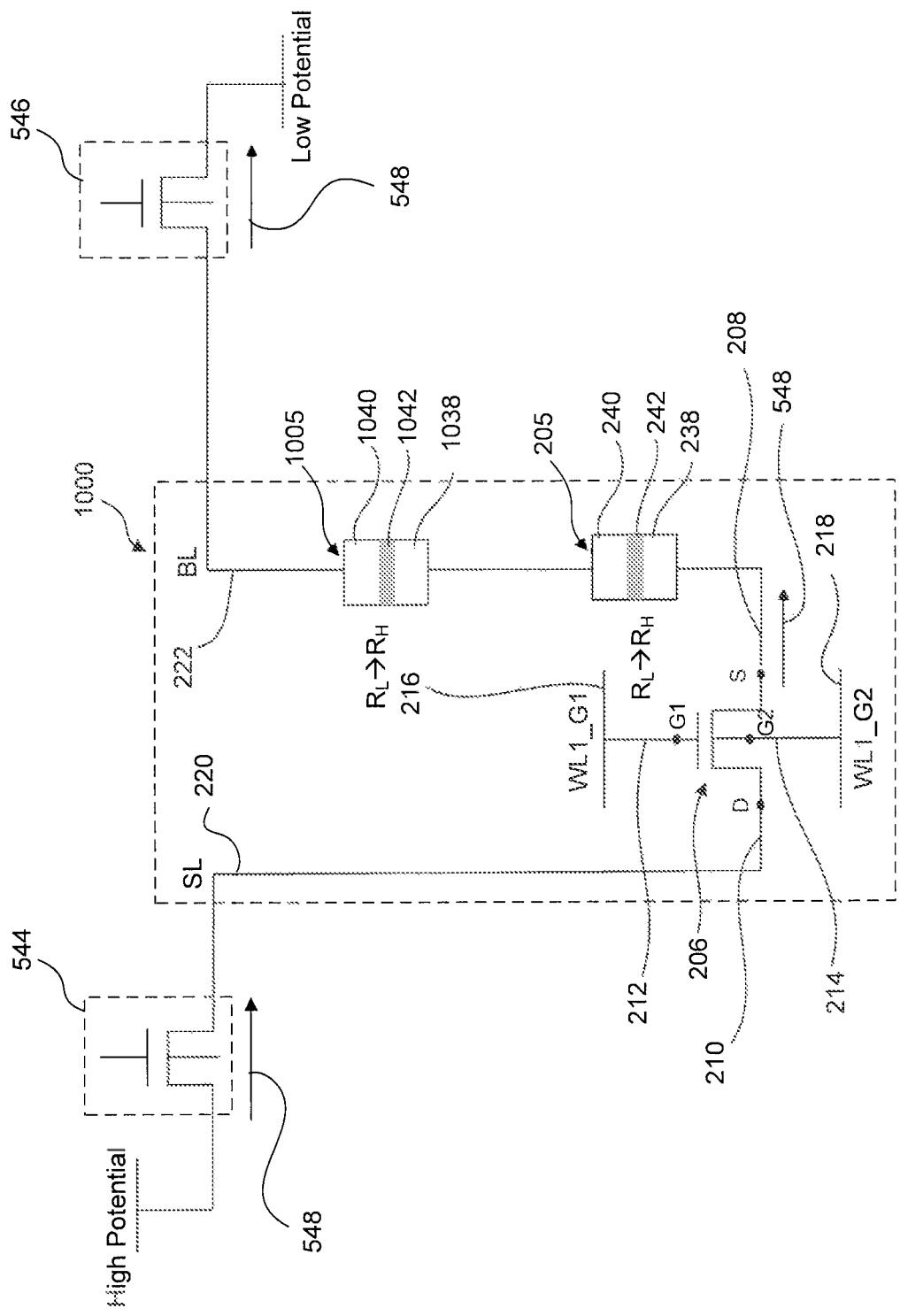
FIG. 11 illustrates an example circuit configuration for a write operation of the memory cell of FIG. 10 to write logical value '1' according to an example of second embodiment of the present disclosure.

Write Mode of Operation of a Memory Cell According to an Example of the Second Embodiment FIG. 11 illustrates an example circuit configuration for a write operation of memory cell 1000 to write logical value '1' according to an example of second embodiment. The example circuit configuration illustrated in FIG. 11 is similar to that of FIG. 5. Therefore, only differences between the configurations of FIG. 11 and FIG. 5 are to be discussed. Memory cell 1000 may be connected between first and second current sources 544 and 546. For the writing of logical value '1' to MTJ devices 205 and 1005, the current flowing in direction 548 may be larger compared to the circuit configuration of FIG. 5 with only MTJ 205. However, the larger current may not affect the voltage value at the first gate G1 of FinFET 206 for the same reason as described above with reference to FIG. 5. The threshold voltage of FinFET 206 may be adjusted with the independently controlled second gate G2 to keep the voltage value at the first gate G1 low.

Figure 12:
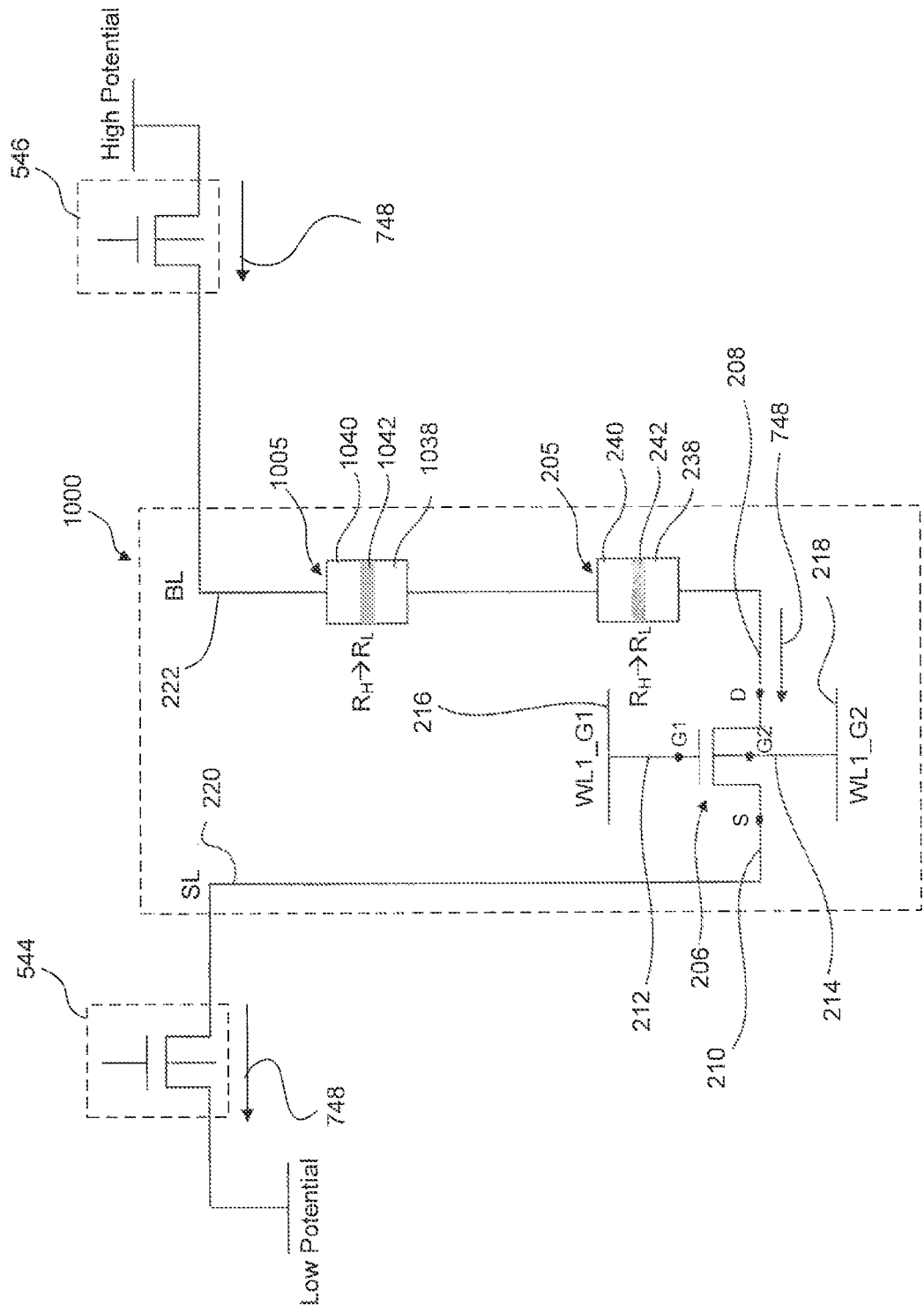
FIG. 12 illustrates an example circuit configuration for a write operation of the memory cell of FIG. 10 to write logical value '0' according to an example of second embodiment of the present disclosure.

FIG. 12 illustrates an example circuit configuration for a write operation of memory cell 1000 to write logical value '0' according to an example of second embodiment. The example circuit configuration illustrated in FIG. 12 is similar to that of FIG. 7, but includes MTJ device 1005 in series with MTJ device 205. The writing of logical value '0' to memory cell 1000 is similar to that described for memory cell 200 in FIG. 7.

Figure 13:
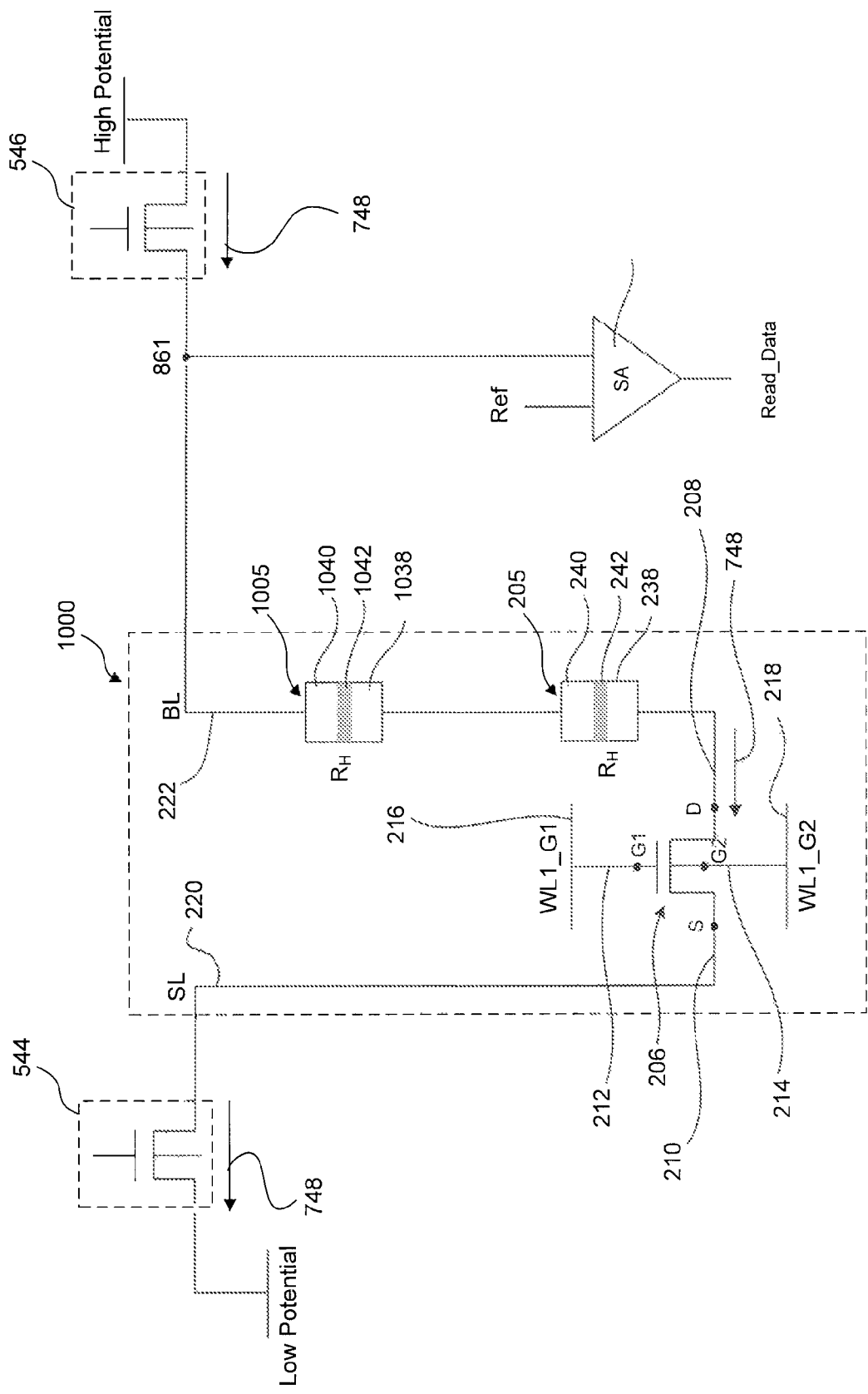
FIG. 13 illustrates an example circuit configuration for a read operation of the memory cell of FIG. 10 to read logical value '1' according to an example of second embodiment of the present disclosure.
Figure 14:
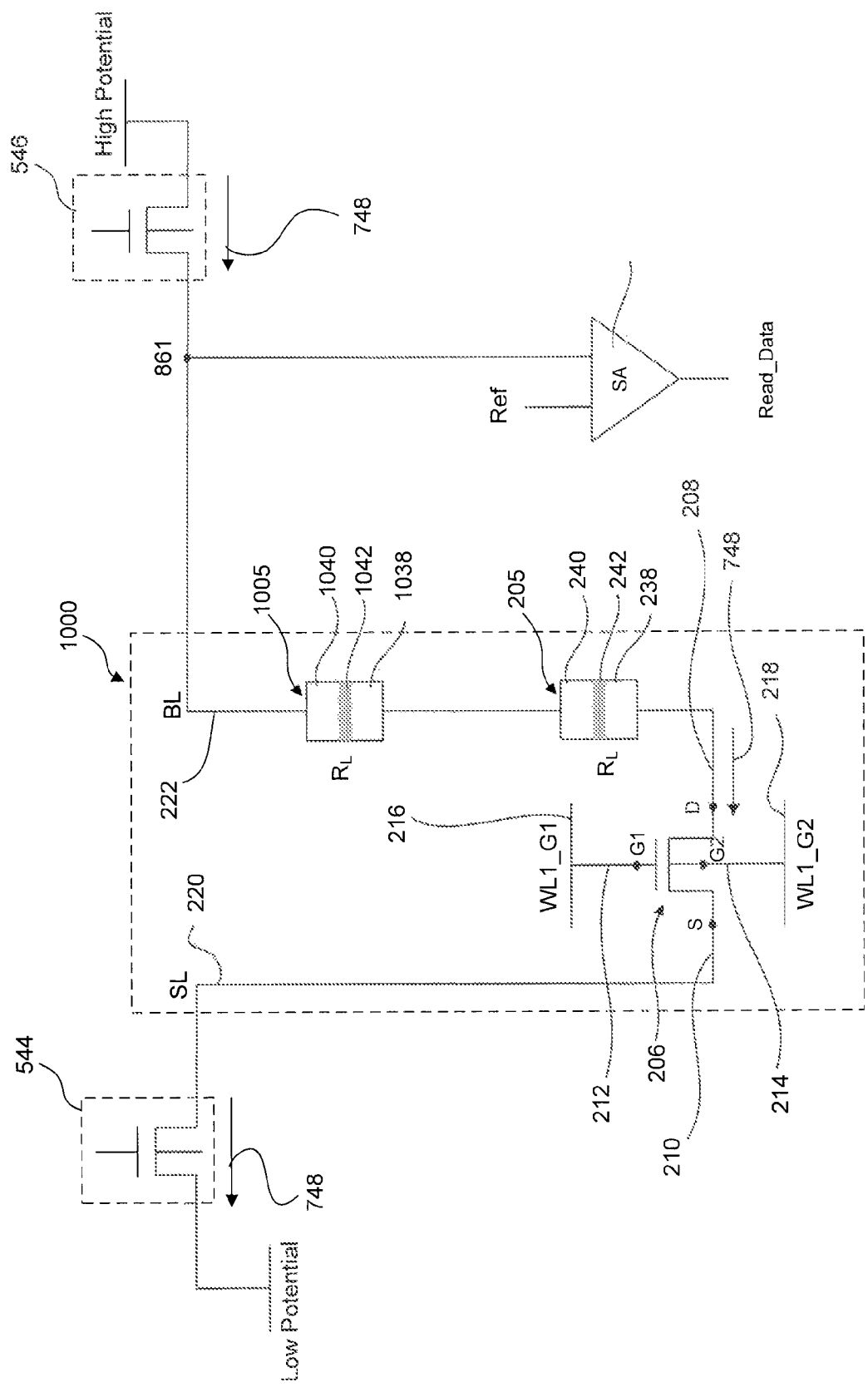
FIG. 14 illustrates an example circuit configuration for a read operation of the memory cell of FIG. 10 to read logical value '0' according to an example of second embodiment of the present disclosure.

Read Mode of Operation of a Memory Cell According to an Example of the Second Embodiment FIG. 13 illustrates an example circuit configuration for a read operation of the memory cell 1000 to read logical value '1' according to an example of second embodiment, while FIG. 14 illustrates an example circuit configuration for a read operation of the memory cell 1000 to read logical value '0' according to an example of second embodiment. The example circuit configurations illustrated in FIGS. 13 and 14 are similar to that of FIGS. 8 and 9, but include MTJ device 1005 in series with MTJ 205. The reading of logical values '1' and '0' from memory cell 1000 is similar to that described for memory cell 200 in FIGS. 8 and 9.

The MTJ devices 205 and 1005 in series may further improve the efficiency of memory cell 1000 compared to that of memory cell 200. This improvement may be due to increase in the read margin between $R_H$ and $R_L$ read by sense amplifier 860 from the memory cell 1000. For example, the total high resistance $R_H$ across MTJ devices 205 and 1005 may be larger than with just MTJ device 205. Even though the total low resistance $R_L$ may also be larger with the two MTJ devices, the increase in total $R_H$ may be much larger with respect to the increase in $R_L$. In addition, multiple stages of sense amplifier may be reduced due to the larger $R_H$ and $R_L$ achieved in memory cell 100 with the two serially connected MTJ devices 205 and 1005. As a result, the power consumption of memory cell 1000 may be reduced compared to memory cells without serially connected MTJ devices. The serially connected MTJ devices in memory cell 1000 may also help to reduce the probability of shift of $R_H$ to $R_L$ with time as high resistance state in MTJ devices may tend to shift towards low resistance state over a period of time.

In an example of this embodiment, read margin may be increased due to MTJ devices 205 and 1005 having different TMR values, different magnetization orientations and/or different number of stacked layers with respect to each other. Higher reliability of memory read operation may be achieved with such increase in read margin.

Layout of a Memory Cell Array According to an Embodiment

Figure 15:
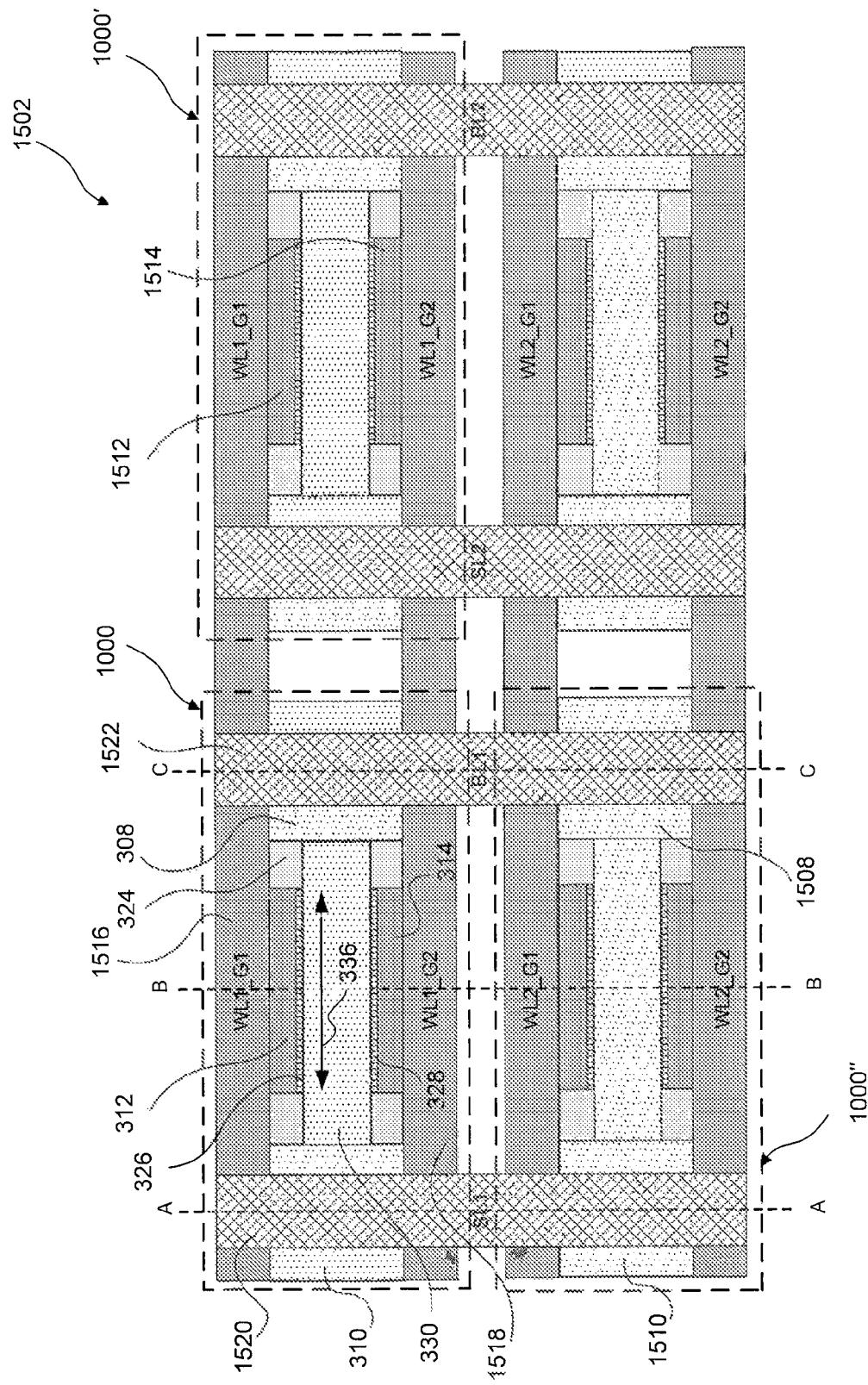
FIG. 15 illustrates a top view of an example layout of a memory array according to an embodiment of the present disclosure.

FIG. 15 illustrates a top view of an example layout of a 2×2 memory array 1502 according to an embodiment. For simplification purposes, only two rows and two columns of example memory array 1502 with four memory cells are shown in FIG. 15. However, as would be understood by a person of skill in the art based on the teachings herein, example memory array 1502 may include any number of rows/columns, depending on the use requirements of the array.

In accordance with an example of this embodiment, each memory cell of memory array 1502 may be represented by memory cell 1000 as described above. FIG. 15 shows an example layout representation of the schematic diagram of memory cell 1000 in FIG. 10. The layout representation of FinFET 206 in memory cell 1000 is similar to that shown in FIG. 3. But FIG. 15 in addition to FIG. 3 illustrates the coupling of conducting layers corresponding to first and second word lines 216 and 218, select line 220, and bit line 222 to FinFET 206.

First and second word line layers 1516 and 1518 corresponding to respective first and second word lines 216 and 218 may be conducting layers running parallel to each other and to a top surface of a planar substrate of FinFET 206, in accordance with an example of this embodiment. First word line layer 1516 may be in substantial contact with first gate region 312 and second word line layer 1518 may be in substantial contact with second gate region 314. First and second word line layers 1516 and 1518 may be shared with memory cells in the same row as memory cell 1000. For example, first and second word line layers 1516 and 1518 may be in substantial contact with first and second gate regions 1512 and 1514 of a FinFET in memory cell 1000'.

According to an example of this embodiment, a select line layer 1520 and a bit line layer 1522 corresponding to respective select line 220, and bit line 222 may be conducting layers running parallel to each other and to a top surface of a planar substrate of FinFET 206. Select line layer 1520 and bit line layer 1522 may be coupled to respective second and first regions 310 and 308 (shown in FIGS. 16 and 18, respectively). Select line layer 1520 and bit line layer 1522 may be shared with memory cells in the same column as memory cell 1000. For example, select line layer 1520 and bit line layer 1522 may be coupled to respective second and first regions 1510 and 1508 of a FinFET in memory cell 1000".

Figure 16:
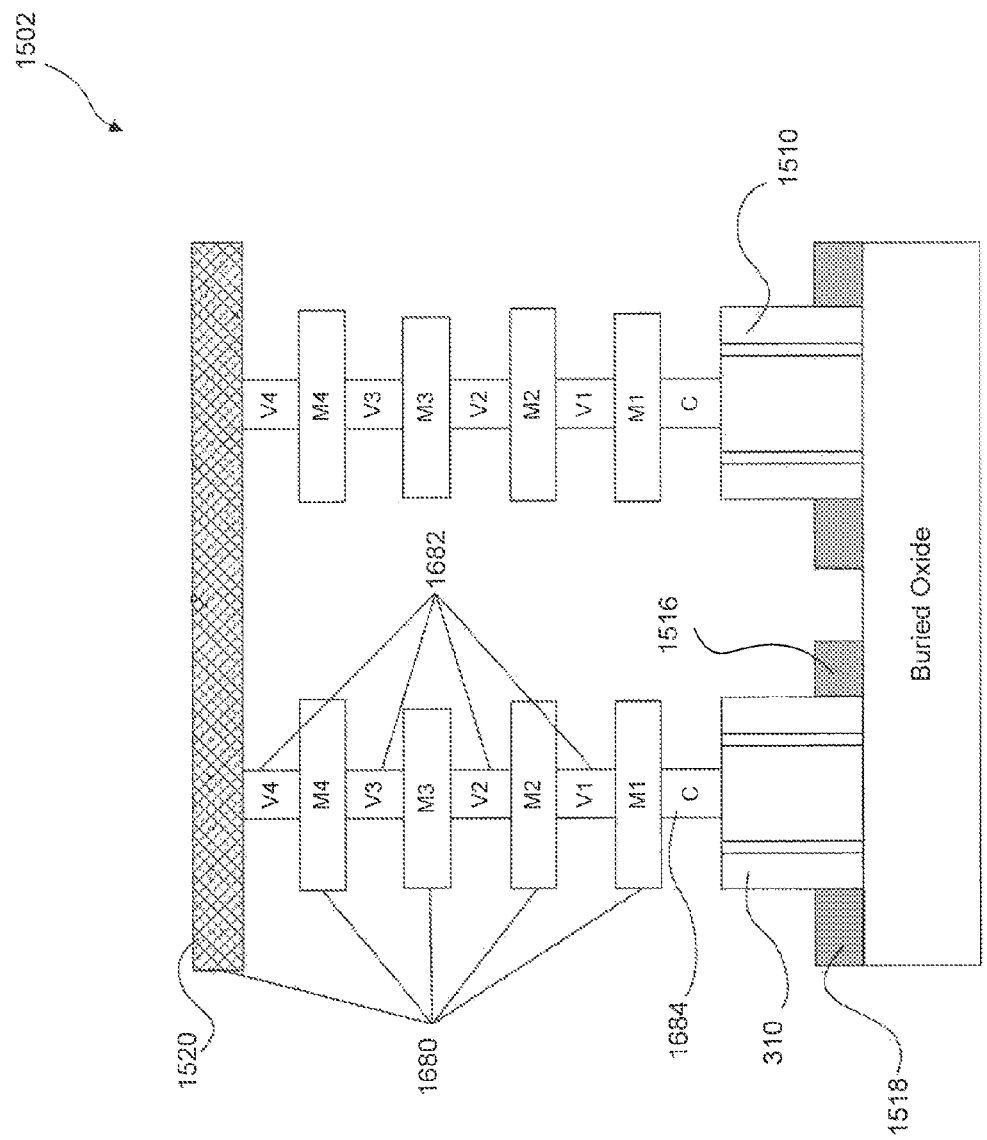
FIG. 16 illustrates a cross sectional view along line A-A of the layout of FIG. 15 according to an embodiment of the present disclosure.

FIG. 16 illustrates a cross sectional view of memory array 1502 along select line layer 1520 (along line A-A of the example layout in FIG. 15) according to an embodiment. In an example of this embodiment, a first stack of conducting layers (e.g., copper, aluminum) 1680 that may include select line layer 1520 may be coupled on to second region 310 through a conductive contact 1684. Conducting layers within the first stack 1680 may be coupled to each other through a plurality of conducting vias 1682. These conduction layers may be part of interconnection circuitry of memory cell 1000.

Figure 17:
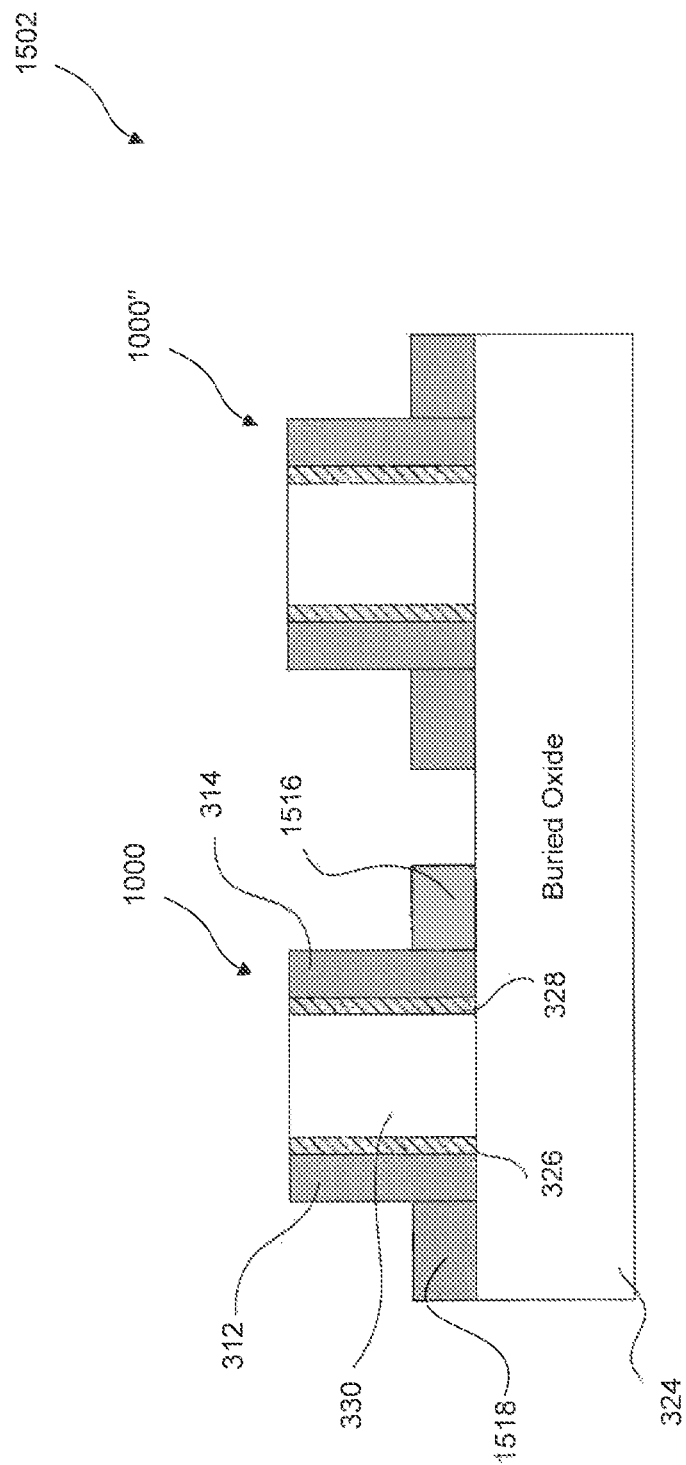
FIG. 17 illustrates a cross sectional view along line B-B of the layout of FIG. 15 according to an embodiment of the present disclosure.
Figure 18:
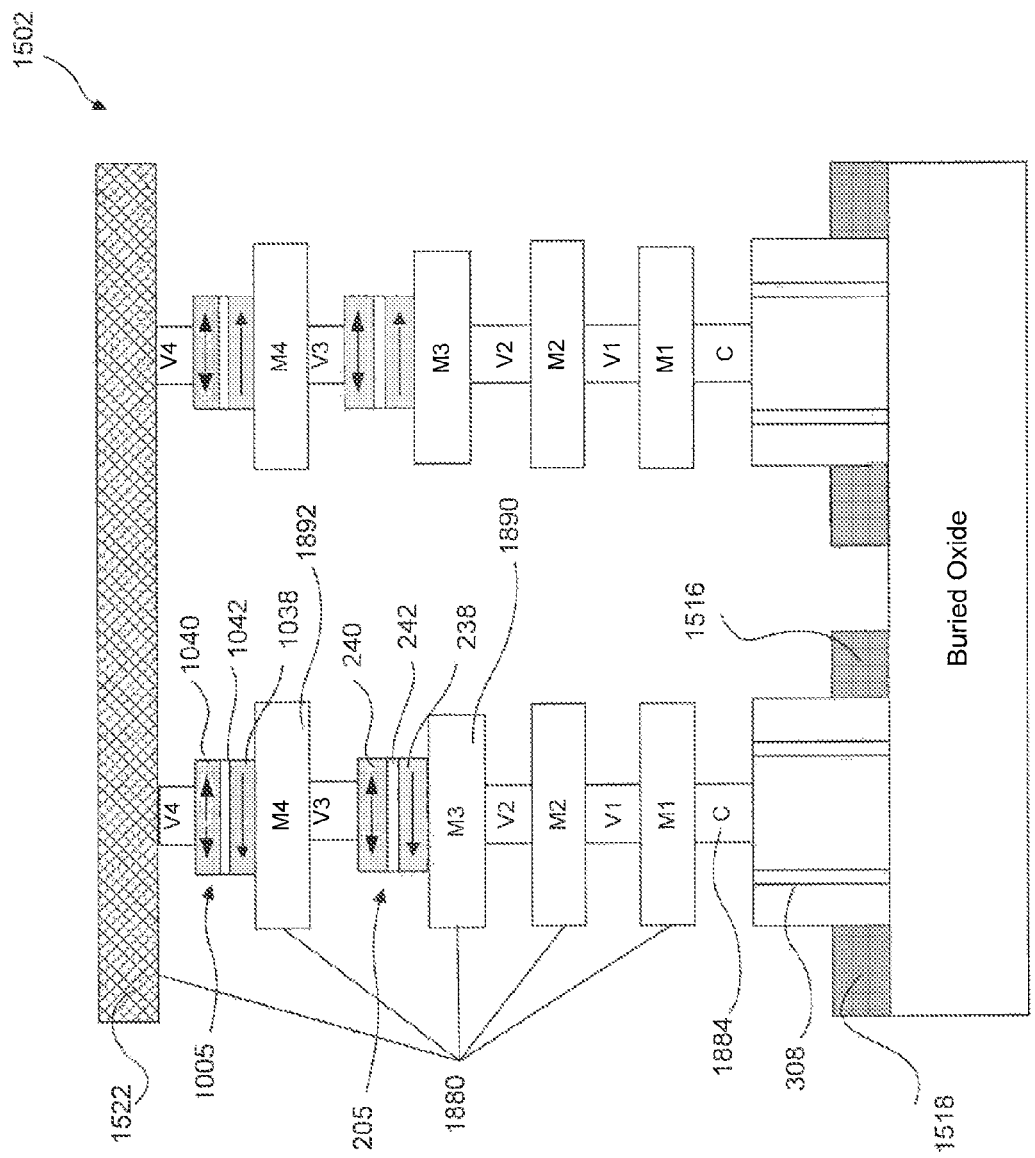
FIG. 18 illustrates a cross sectional view along line C-C of the layout of FIG. 15 according to a first embodiment of the present disclosure.

FIG. 17 illustrates a cross sectional view of memory cell 1000 across first and second word line layers 1516 and 1518 (along line B-B of the example layout in FIG. 15) according to an embodiment. The regions illustrated in FIG. 17 have been described above in reference to FIG. 3 and FIG. 15. FIG. 18 illustrates a cross sectional view of memory array 1502 along bit line layer 1522 (along line C-C of the example layout of FIG. 15) according to an embodiment. In an example of this embodiment, a second stack of conducting layers (e.g., copper, aluminum) 1880 that may include bit line layer 1520 may be coupled on to first region 308 through a conductive contact 1884. Conducting layers within the first stack 1680 may be coupled to each other through a plurality of conducting vias 1882. These conduction layers may be part of interconnection circuitry of memory cell 1000. Second stack of conducting layers 1880 may include MTJ devices 205 and 1005. In an example of this embodiment, MTJ device 205 may be placed between bit line layer 1522 and conducting layer 1890, while MTJ device 1005 may be placed between conducting layers 1890 and 1892. MTJ device 205 may be configured to have its first FM layer 238 or its second FM layer 240 in substantial contact with conducting layer 1890. Similarly, MTJ device 1005 may be configured to have its first FM layer 1038 or its second FM layer 1040 in substantial contact with conducting layer 1892.

According to an example of this embodiment, each MTJ device may be placed between adjacent conducting layers (e.g., between layer 1890 and 1892). Alternatively, MTJ device 1005 may be stacked on MTJ device 205 with first FM layer 1038 of MTJ 1005 being in substantial contact with second FM layer 240 of MTJ 205 (not shown). This stack of MTJ devices may be placed between adjacent conducting layers.

It is to be appreciated that the Detailed Description section, and not the Abstract section, is intended to be used to interpret the claims. The Abstract section can set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It will be apparent to those skilled in the relevant art(s) that various changes in form and detail can be made therein without departing from the spirit and scope of the present disclosure. Thus, the present disclosure should not be limited by any of the above-described exemplary embodiments, but should be defined only in accordance with the following claims and their equivalents.

What is claimed is:

1. A memory device, comprising:
   a magnetic storage element; and
   an access transistor, coupled to the magnetic storage element, having a first gate and a second gate,
   wherein the first gate and the second gate are configured to be isolated electrically from each other, and
   wherein the first gate is configured to activate the access transistor and the second gate is configured to adjust a threshold voltage value of the access transistor;
   a word line coupled to the access transistor; and
   first and second fin field effect transistor (FinFET) based sources,
   wherein the first FinFET based source is configured to be at a greater potential than the second FinFET based source to orient a magnetization direction of the magnetic storage element in a first direction corresponding to a logical one or at a lesser potential than the second FinFET based source to orient the magnetization direction of the magnetic storage element in a second direction corresponding to a logical zero, and
   wherein the access transistor is configured to be activated, in response to controlling the word line, to provide a first current from the first FinFET based source to the second FinFET based source to orient the magnetization direction of the magnetic storage element in the first direction or to provide a second current from the second FinFET based source to the first FinFET based source to orient the magnetization direction of the magnetic storage element in the second direction.

2. The memory device of claim 1, wherein the word line comprises a first word line and a second word line configured to control the access transistor, and
wherein the first word line and the second word line are respectively coupled to a terminal of the first gate and a terminal of the second gate.

3. The memory device of claim 2, wherein the first word line and the second word line are configured to apply a voltage value to the first gate terminal and the second gate terminal, respectively, based on a mode of operation of the memory device.

4. The memory device of claim 1, further comprising:
a sense amplifier;
a select line coupled to the access transistor; and
a bit line coupled to the magnetic storage element and the sense amplifier.

5. The memory device of claim 1, wherein the access transistor is a dual gate FinFET.

6. The memory device of claim 1, wherein the magnetic storage element comprises a first ferromagnetic layer and a second ferromagnetic layer, the first ferromagnetic layer and the second ferromagnetic layer being separated by an insulating layer and having magnetization directions parallel or perpendicular to the second ferromagnetic layer and the first ferromagnetic layer, respectively.

7. The memory device of claim 6, wherein the first ferromagnetic layer comprises a magnetization that is fixed in a predetermined direction, and
wherein the second ferromagnetic layer comprises a magnetization that changes directions based on current applied to the magnetic storage element.

8. The memory device of claim 1, wherein the magnetic storage element comprises a single barrier magnetic tunnel junction (MTJ) device.

9. The memory device of claim 1, wherein the magnetic storage element comprises a double barrier magnetic tunnel junction (MTJ) device.

10. The memory device of claim 1, wherein the first FinFET based source is a first current source, and wherein the second FinFET based source is a second current source.

11. The memory device of claim 1, further comprising a second magnetic storage element connected electrically in series with the magnetic storage element and located between the access transistor and a bit line.

12. The memory device of claim 1, wherein the second gate is configured to adjust the threshold voltage value based on a mode of operation of the memory device.

13. A memory device, comprising:
an access transistor having a source region, a drain region, a first gate region, and a second gate region on a top surface of a planar substrate;
a first magnetic storage element and a second magnetic storage element,
wherein the first magnetic storage element is stacked on the second magnetic storage element between a bit line and the source region or the drain region;
a word line coupled to the access transistor; and
first and second fin field effect transistor (FinFET) based sources,
wherein the first FinFET based source is configured to be at a greater potential than the second FinFET based source to orient magnetization directions of the first and second magnetic storage elements in a first direction corresponding to a logical one or at a lesser potential than the second FinFET based source to orient the magnetization directions of the first and second magnetic storage elements in a second direction corresponding to a logical zero, and
wherein the access transistor is configured to be activated, in response to controlling the word line, to provide a first current from the first FinFET based source to the second FinFET based source to orient the magnetization directions of the first and second magnetic storage elements in the first direction or to provide a second current from the second FinFET based source to the first FinFET based source to orient the magnetization directions of the first and second magnetic storage elements in the second direction.

14. The memory device of claim 13, further comprising a plurality of conducting layers stacked and coupled to the source region and the drain region, running parallel to the top surface of the planar substrate.

15. The memory device of claim 14, wherein a conducting layer of a first stack of the plurality of conducting layers comprises a bit line, and
wherein a conducting layer of a second stack of the plurality of conducting layers comprises a select line.

16. The memory device of claim 14, wherein at least a conducting layer of the plurality of conducting layers is configured to electrically couple a first ferromagnetic layer of the first magnetic storage element to a second ferromagnetic layer of the second magnetic storage element.

17. The memory device of claim 13, wherein the first magnetic storage element and the second magnetic storage element have at least two ferromagnetic layers separated by an insulating layer, the at least two ferromagnetic layers comprising magnetization directions parallel or perpendicular to the surface of the planar substrate.

18. The memory device of claim 13, wherein the first magnetic storage element and the second magnetic storage element comprise:
magnetic tunnel junction (MTJ) devices.

19. The memory device of claim 13, wherein the first gate region and the second gate region are configured to be electrically isolated from each other.

20. The memory device of claim 13, wherein the first gate region and the second gate region are capacitively coupled to a first side and a second side of a fin region of the access transistor, respectively.

21. A memory device, comprising:
a fin field effect transistor (FinFET) having a source region and a drain region;
a stack of conducting layers on the source region or the drain region;
a stack of magnetic tunnel junction (MTJ) devices on the stack of conducting layers;
a word line coupled to the FinFET; and
first and second FinFET based sources,
wherein the first FinFET based source is configured to be at a greater potential than the second FinFET based source to orient magnetization directions of the stack of MTJ devices in a first direction corresponding to a logical one or at a lesser potential than the second FinFET based source to orient the magnetization directions of the stack of MTJ devices in a second direction corresponding to a logical zero, and
wherein the FinFET is configured to be activated, in response to controlling the word line, to provide a first current from the first FinFET based source to the second FinFET based source to orient the magnetization directions of the stack of MTJ devices in the first direction or to provide a second current from the second FinFET based source to the first FinFET based source to orient the magnetization directions of the stack of MTJ devices in the second direction.

22. The memory device of claim 21, wherein the stack of MTJ devices comprises:
   a first MTJ device positioned between a bit line and the stack of conducting layers; and
   a second MTJ device positioned between the bit line and the first MTJ device.

* * * * *